(12) United States Patent
Yoo et al.

(10) Patent No.: US 8,426,304 B2
(45) Date of Patent: Apr. 23, 2013

(54) METHODS OF MANUFACTURING A VERTICAL TYPE SEMICONDUCTOR DEVICE

(75) Inventors: Dong-Chul Yoo, Seongham-si (KR); Chan-Jin Park, Yongin-si (KR); Ki-Hyun Hwang, Seongnam-si (KR); Han-Mei Choi, Seoul (KR); Joon-Suk Lee, Bucheon-si (KR)

(73) Assignee: Samsung Electronics Co., Ltd. (KR)

( * ) Notice: Subject to any disclaimer, the term of this patent is extended or adjusted under 35 U.S.C. 154(b) by 45 days.

(21) Appl. No.: 13/241,316

(22) Filed: Sep. 23, 2011

(65) Prior Publication Data
US 2012/0115309 A1    May 10, 2012

(30) Foreign Application Priority Data
Nov. 8, 2010   (KR) .......................... 10-2010-0110153

(51) Int. Cl.
*H01L 21/4763*   (2006.01)
(52) U.S. Cl.
USPC .................... 438/618; 438/128; 257/E21.577

(58) Field of Classification Search ................. 438/599; 257/E21.532, E21.533, E21.534, E21.536
See application file for complete search history.

(56) References Cited

U.S. PATENT DOCUMENTS
2010/0013049 A1*   1/2010   Tanaka et al. ................. 257/532

FOREIGN PATENT DOCUMENTS
JP        2009-200443        9/2009
JP        2009-238874        10/2009
KR    1020090128776 A       12/2009

* cited by examiner

*Primary Examiner* — Cheung Lee
(74) *Attorney, Agent, or Firm* — Myers Bigel Sibley & Sajovec

(57) ABSTRACT

Methods of manufacturing a semiconductor device include forming a stopping layer pattern in a first region of a substrate. A first mold structure is formed in a second region of the substrate that is adjacent the first region. The first mold structure includes first sacrificial patterns and first interlayer patterns stacked alternately. A second mold structure is formed on the first mold structure and the stopping layer pattern. The second mold structure includes second sacrificial patterns and second interlayer patterns stacked alternately. The second mold structure partially covers the stopping layer pattern. A channel pattern is formed and passes through the first mold structure and the second mold structure.

20 Claims, 10 Drawing Sheets

METHODS OF MANUFACTURING A VERTICAL TYPE SEMICONDUCTOR DEVICE

CLAIM OF PRIORITY

This application claims priority under 35 USC §119 to Korean Patent Application No. 10-2010-0110153, filed on Nov. 8, 2010 in the Korean Intellectual Property Office (KIPO), the contents of which is herein incorporated by reference in its entirety.

BACKGROUND

Recently, methods of integrating cells in a vertical direction with respect to a substrate have been developed to accomplish a high integration of semiconductor devices. To form the semiconductor devices including cells having a vertically integrated structure, a sacrificing layer and an insulating layer are laminated and then etched to form an opening portion. However, as the number of the laminated layers increases, a problem of lifting off of the layers are frequently generated. In addition, the formation of channel layer patterns of a vertical structure having uniform heights may be challenging.

SUMMARY

Some embodiments provide methods of manufacturing a vertical type semiconductor device having a reduced defect generating ratio due to lifting off of a layer and so producing a device having a high reliability.

According to example embodiments, there is provided a method of manufacturing a vertical type semiconductor device. In some embodiments, an insulating interlayer pattern and a stopping layer pattern are integrated on a substrate in a peripheral region. The substrate includes a cell region and the peripheral region. A first mold structure is formed by alternately integrating a lower sacrificing layer pattern and a lower insulating interlayer pattern on the substrate in the cell region. A preliminary second mold structure is formed by alternately integrating a sacrificing layer and an insulating interlayer on the first mold structure and the stopping layer pattern. A portion of the preliminary second mold structure is partially etched to expose the stopping layer pattern and to form a second mold structure covering at least a whole cell region. A channel layer pattern penetrating the first and second mold structures is formed and a thin layer structure is formed by integrating a blocking dielectric layer, a charge storing layer and a tunnel insulating interlayer on a sidewall portion of the channel layer pattern. A third mold structure is formed by patterning the second mold structure so that an edge portion of the sacrificing layer included in each layer included in the second mold structure makes a step-like shape. A gate electrode is formed around the sacrificing layer patterns included in the first and third mold structures.

Some embodiments may further include forming peripheral circuit devices on the substrate in the peripheral region.

In some embodiments, the integrating of the insulating interlayer pattern and the stopping layer pattern may be performed as follows. An insulating interlayer for the peripheral circuit device covering the peripheral circuit devices may be formed. A stopping layer may be formed on the insulating interlayer for the peripheral circuit device. A portion of the stopping layer and the insulating interlayer for the peripheral circuit device may be etched to expose the substrate in the cell region.

In some embodiments, the stopping layer pattern may be formed using a material having an etching selectivity with respect to the sacrificing layer and the insulating interlayer, respectively, included in the third mold structure.

In some embodiments, the stopping layer pattern may be formed using polysilicon.

In some embodiments, the second mold structure may be larger than the cell region and may be smaller than a total size of the cell region and the peripheral region.

In some embodiments, the insulating interlayer may include silicon oxide and the sacrificing layer may include silicon nitride.

In some embodiments, the forming of the channel layer pattern and the thin layer structure may include forming channel holes exposing a surface portion of the substrate by etching a portion of the first and second mold structures. The thin layer structure may be formed by integrating the blocking dielectric layer, the charge storing layer and the tunnel insulating interlayer on the sidewall portion of the channel holes. The channel layer pattern may be formed by filling up the channel holes with a semiconductor material.

In some embodiments, forming the gate electrode may include forming an opening portion by etching a portion of the first and third mold structures. The sacrificing patterns may be removed to form a groove portion between the insulating interlayer patterns included in the first and third mold structures. The gate electrode may be formed by filling up the groove portion with a conductive material.

In some embodiments, the stopping layer pattern may be positioned on a same plane with an uppermost surface of the first mold structure or may be positioned on a higher portion than the uppermost surface of the first mold structure.

In some embodiments, a side edge portion of the sacrificing layer pattern of each layer included in the first mold structure may be formed to have a step-like shape.

Some embodiments may further include forming a second insulating interlayer pattern and a second stopping layer pattern on the stopping layer pattern formed in the peripheral region.

In some embodiments, the second stopping layer pattern may be formed using the same material used for forming the sacrificing layer pattern.

In some embodiments, the second stopping layer pattern may be formed using silicon nitride.

In some embodiments, the gate electrode may include a metal material.

Some embodiments may further include forming a first insulating interlayer on a whole substrate of the cell region and the peripheral region so as to cover the second preliminary mold structure.

Some embodiments may further include forming a second insulating interlayer on the whole substrate of the cell region and the peripheral region so as to cover the third mold structure and planarizing an upper surface portion of the second insulating interlayer.

Some embodiments may further include removing the stopping layer pattern after forming the third mold structure.

Some embodiments may further include forming a bit line electrically contacting an upper surface portion of the channel layer pattern.

Some embodiments may further include forming a contact plug and a wiring electrically contacting an edge portion of the gate electrode in each layer.

According to example embodiments, defects due to lifting off of an integrated structure of a sacrificing layer and an insulating interlayer may be reduced. In addition, vertical type channels may be formed with a uniform height and electric characteristics of selecting transistor at an uppermost portion may be kept uniformly. A vertical type semiconductor device having a high reliability may be formed.

It is noted that aspects of the invention described with respect to one embodiment, may be incorporated in a different embodiment although not specifically described relative thereto. That is, all embodiments and/or features of any embodiment can be combined in any way and/or combination. These and other objects and/or aspects of the present invention are explained in detail in the specification set forth below.

BRIEF DESCRIPTION OF THE DRAWINGS

Example embodiments will be more clearly understood from the following detailed description taken in conjunction with the accompanying drawings.

FIGS. 1 to 18 are cross-sectional views for explaining methods of manufacturing a vertical type semiconductor device in accordance with some embodiments described herein.

FIG. 19 illustrates a device including a vertical type semiconductor device in accordance with example embodiments described herein.

FIG. 20 illustrates another device including a vertical type semiconductor device in accordance with another embodiments described herein.

FIG. 21 illustrates further another device including a vertical type semiconductor device in accordance with further another embodiments described herein.

DETAILED DESCRIPTION OF THE EMBODIMENTS

Figure 1:
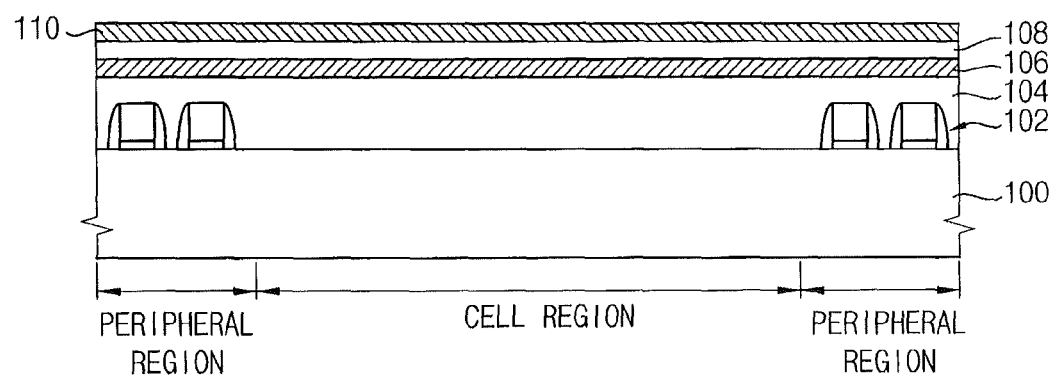
FIGS. 1 to 21 represent example embodiments as described herein.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, some embodiments of methods of manufacturing vertical type semiconductor devices will be explained in detail with reference to attached drawings.

Reference is now made to FIGS. 1 to 18, which are cross-sectional views for explaining a method of manufacturing a vertical type semiconductor device in accordance with some example embodiments.

Referring to FIG. 1, a semiconductor substrate 100 may be provided. The semiconductor substrate 100 may include a cell region in which memory cells may be formed and a peripheral region in which peripheral circuits may be formed. The semiconductor substrate 100 may be a single crystalline silicon substrate.

On the substrate 100 in the peripheral region, unit devices forming the peripheral circuits may be formed. The unit devices may include transistors 102 and contact plugs (not shown). A first insulating interlayer 104 covering the unit devices may be formed on the substrate 100. The first insulating interlayer 104 may be formed by depositing silicon oxide. An upper surface of the first insulating interlayer 104 may be planarized so as to form a planar upper surface of the first insulating interlayer 104. The planarization process may be performed by means of a chemical mechanical polishing process or an etch back process.

On the first insulating interlayer 104, a first etch stopping layer 106 may be formed. The first etch stopping layer 106 may be used as a stopping layer during etching silicon oxide and silicon nitride included in a mold structure to be formed in a following process. Therefore, the first etch stopping layer 106 may be formed by depositing a material having a high etching selectivity with respect to both of silicon oxide and silicon nitride. Particularly, the first etch stopping layer 106 may be formed by depositing polysilicon. On the first etch stopping layer 106, a pad oxide layer 108 and a second etch stopping layer 110 may be sequentially formed. The second etch stopping layer 110 may be formed by depositing a material having a high selectivity with respect to silicon oxide. Particularly, the second etch stopping layer 110 may be formed by depositing silicon nitride.

Figure 2:
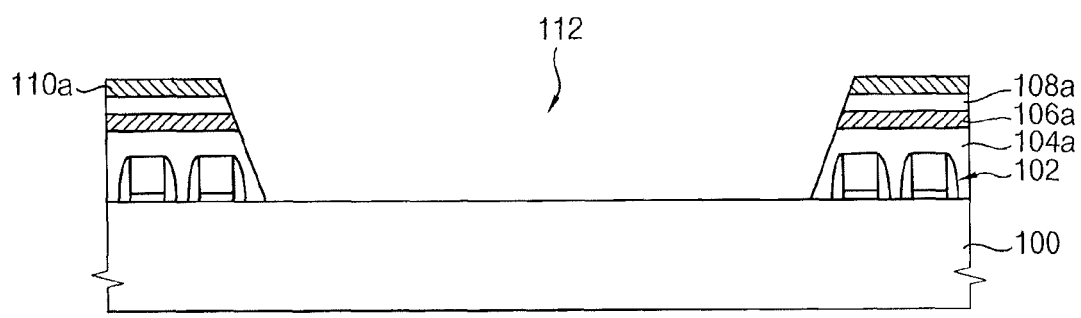

Referring to FIG. 2, an etching mask pattern (not shown) covering only the peripheral region may be formed on the second etch stopping layer 110. Particularly, the etching mask pattern may be a photoresist pattern.

The second etch stopping layer 110, the pad oxide layer 108, the first etch stopping layer 106 and the first insulating interlayer 104 may be sequentially etched using the etching mask pattern to form an opening 112 exposing a surface portion of the substrate 100 in the cell region. Through performing the etching process, a first insulating interlayer pattern 104a, a first etch stopping layer pattern 106a, a pad oxide layer pattern 108a and a second etch stopping layer pattern 110a covering the peripheral circuits may be formed on the substrate 100 in the peripheral region. Then, the entire surface portion of the substrate 100 in the cell region may be exposed.

Figure 3:
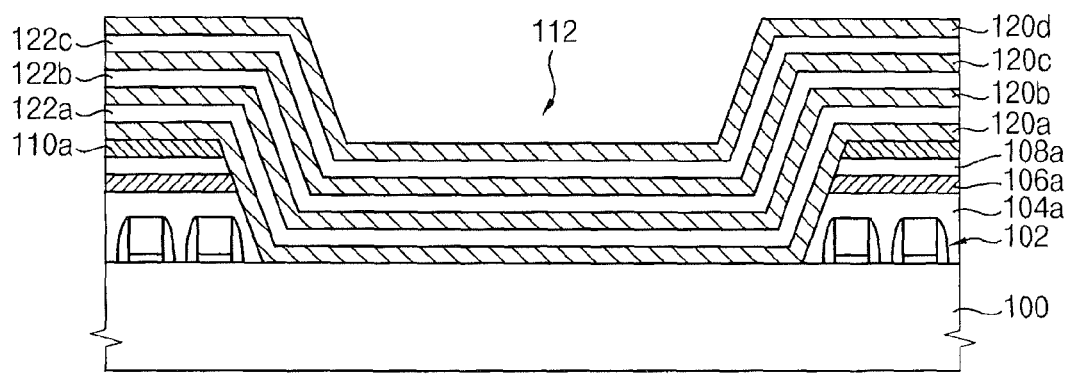

Referring to FIG. 3, on the substrate 100, first, second, third and fourth sacrificing layers 120a, 120b, 120c and 120d and second, third and fourth insulating interlayers 122a, 122b and 122c may be alternately formed. The first, second, third and fourth sacrificing layers 120a, 120b, 120c and 120d and the second, third and fourth insulating interlayer 122a, 122b and 122c may be formed to fill up the inner portion of the opening formed in the cell region. Particularly, the first sacrificing layer 120a, the second insulating layer 122a, the second sacrificing layer 120b, the third insulating interlayer 122b, the third sacrificing layer 120c, the fourth insulating interlayer 122a and the fourth sacrificing layer 120d may be integrated on the substrate 100 in the cell region.

Figure 4:
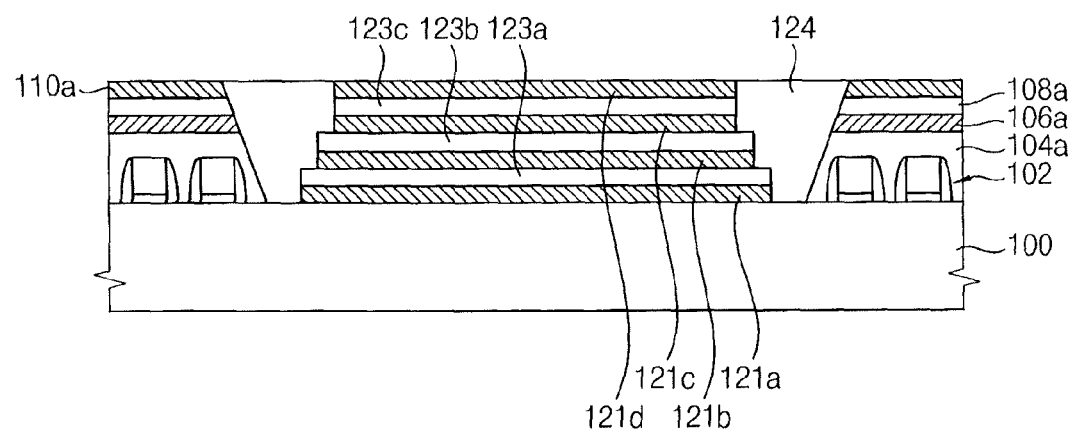

Referring to FIG. 4, the first, second, third and fourth sacrificing layers 120a, 120b, 120c and 120d and the second, third and fourth insulating interlayers 122a, 122b and 122c may be partially and sequentially etched to form a first preliminary mold structure having an integrated structure of first, second, third and fourth sacrificing layer patterns 121a, 121b, 121c and 121d and second, third and fourth insulating interlayer patterns 123a, 123b and 123c on the substrate 100 in the cell region.

The first preliminary mold structure may be formed on the substrate 100 in the cell region. The first, second, third and fourth sacrificing layer patterns 121a, 121b, 121c and 121d included in the first preliminary mold structure may have a step-like side edge portion. That is, an area of underlying sacrificing layer patterns may be wider than upper-positioned sacrificing layer patterns. The length of the sacrificing layer pattern may be gradually reduced from the pattern at the bottom portion to the pattern at the upper portion.

Through performing the etching process, all of the first, second, third and fourth sacrificing layers 120a, 120b, 120c and 120d and the second, third and fourth insulating interlayers 122a, 122b and 122c formed on the second etch stopping layer pattern 110a in the peripheral region may be removed. However, during etching the first, second, third and fourth sacrificing layers 120a, 120b, 120c and 120d and the second, third and fourth insulating interlayers 122a, 122b and 122c, the peripheral circuit devices provided under the second etch stopping layer pattern 110a may not be damaged by the etching process since the second etch stopping layer pattern 110a may be used as an etch stopping layer.

Insulating material may be deposited to cover the first preliminary mold structure and to fill up outer groove portions around the first preliminary mold structure. Then, the deposited insulating material may be polished to form an insulating material layer 124 and to expose an upper surface portion of the second etch stopping layer pattern 110a. For the second etch stopping layer pattern 110a, polishing of the insulating material to an accurate position may be possible to form the insulating material layer 124.

Figure 5:
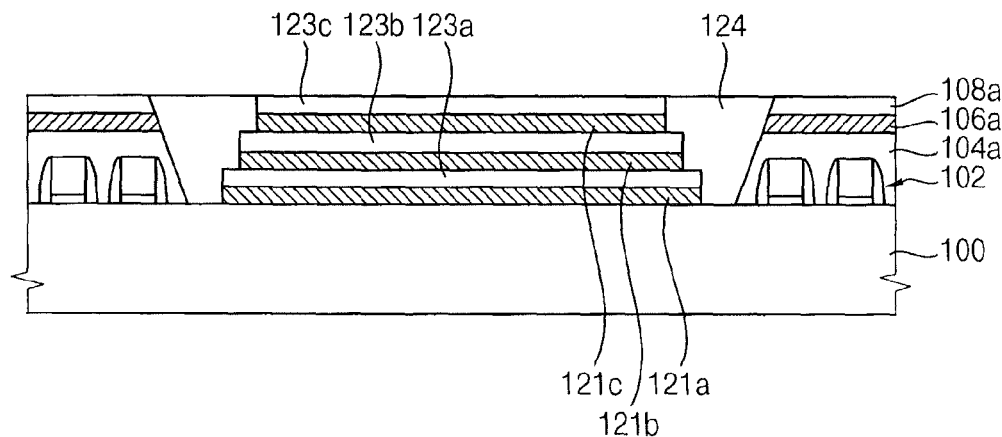

Referring to FIG. 5, the exposed uppermost second etch stopping layer pattern 110a and the fourth sacrificing layer pattern 121d may be removed. After that, an upper surface portion of the preliminary first mold structure may be polished to planarize. After performing the polishing process, the upper portion of the substrate 100 in the peripheral region and the cell region may be covered with the pad oxide layer pattern 108a, the insulating material layer 124 and the fourth insulating interlayer pattern 123a. The pad oxide layer pattern 108a, the insulating material layer 124 and the fourth insulating interlayer pattern 123a on the substrate 100 in the peripheral region and the cell region may have a planar surface.

Figure 6:
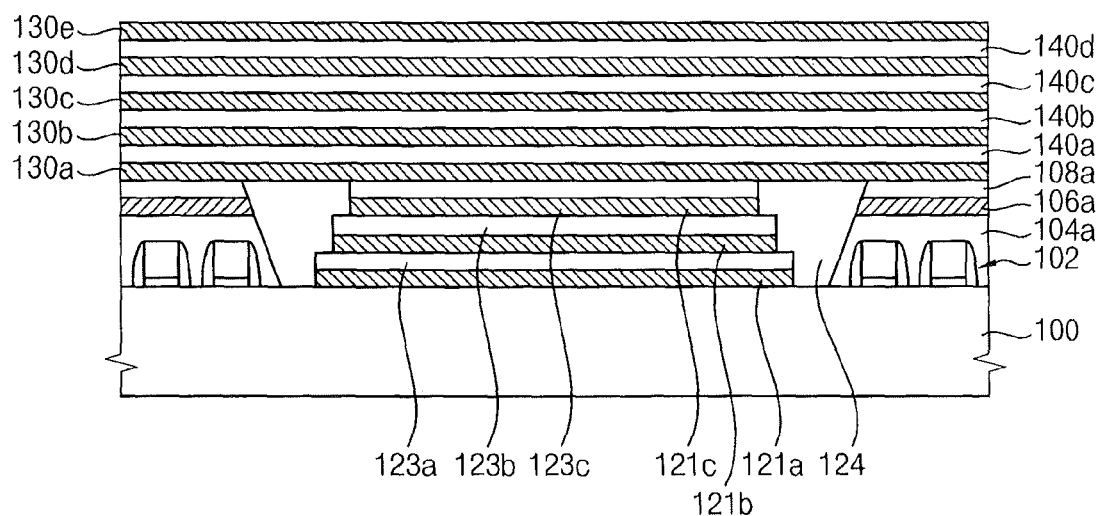

Referring to FIG. 6, fifth, sixth, seventh, eighth and ninth sacrificing layers 130a, 130b, 130c, 130d and 130e and fifth, sixth, seventh and eighth insulating interlayers 140a, 140b, 140c and 140d may be alternately integrated on the pad oxide layer pattern 108a, the insulating material layer 124 and the fourth insulating interlayer pattern 123c to form a second preliminary mold structure. In some embodiments, the second preliminary mold structure may include a sequentially integrated structure of the fifth sacrificing layer 130a, the fifth insulating interlayer 140a, the sixth sacrificing layer 130b, the sixth insulating interlayer 140b, the seventh sacrificing layer 130c, the seventh insulating interlayer 140c, the eighth sacrificing layer 130d, the eighth insulating interlayer 140d and the ninth sacrificing layer 130e.

Figure 7:
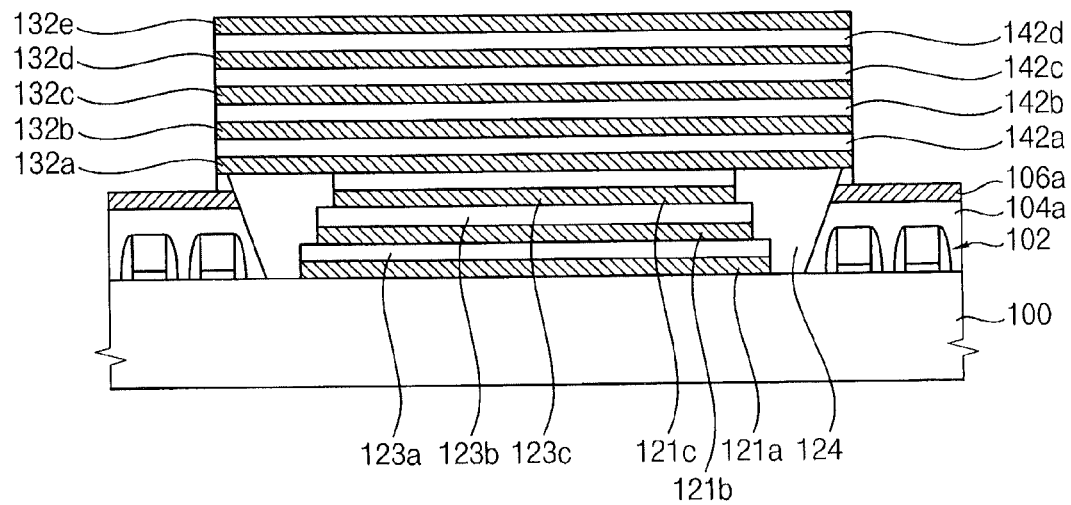

Referring to FIG. 7, an etching mask pattern (not shown) may be formed on the second preliminary mold structure. The etching mask pattern may be formed to cover an entire surface portion of the cell region. Some embodiments provide that the etching mask pattern may be formed to cover the entire surface portion of the cell region and a portion of the peripheral region neighboring the edge portion of the cell region. The etching mask pattern may have a larger area than that of the cell region. The etching mask pattern may have a smaller area than the total area of the cell region and the peripheral region.

The second preliminary mold structure may be etched using the etching mask pattern to form a third preliminary mold structure. The fifth, sixth, seventh, eighth and ninth sacrificing layers 130a, 130b, 130c, 130d and 130e and fifth, sixth, seventh and eighth insulating interlayers 140a, 140b, 140c and 140d may be sequentially etched to form fifth, sixth, seventh, eighth and ninth preliminary sacrificing layer patterns 132a, 132b, 132c, 132d and 132e and fifth, sixth, seventh and eighth preliminary insulating interlayer patterns 142a, 142b, 142c and 142d.

Further, the second preliminary mold structure may be etched to expose the upper surface portion of the first etch stopping layer pattern 106a formed in the peripheral region. Through etching the thin layers using the first etch stopping layer pattern 106a, the fifth, sixth, seventh, eighth and ninth sacrificing layers 130a, 130b, 130c, 130d and 130e and fifth, sixth, seventh and eighth insulating interlayers 140a, 140b, 140c and 140d may be etched to an accurate position without damaging the first mold structure formed in the cell region.

The third preliminary mold structure may be formed to cover the cell region. That is, the third preliminary mold structure may have a larger area than that of the cell region. Further, the third preliminary mold structure may have a smaller area than the total area of the cell region and the peripheral region. Particularly, the third preliminary mold structure may be formed in the cell region and in the peripheral region adjacent to the cell region. The third preliminary mold structure may have a vertical sidewall.

Figure 8:
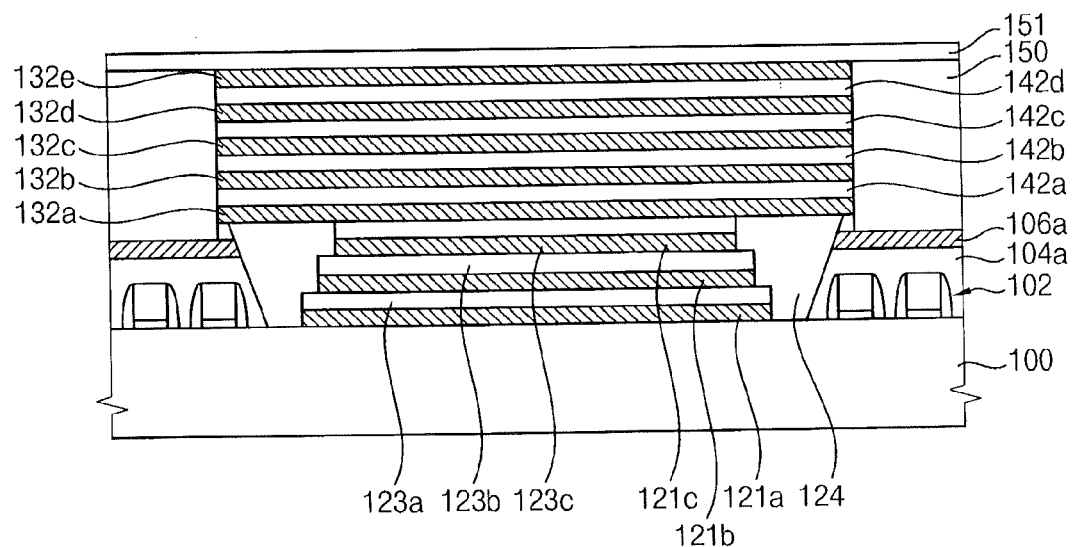

Referring to FIG. 8, a ninth insulating interlayer 150 may be formed at both sides of the third preliminary mold structure in the peripheral region. In this case, the ninth insulating interlayer 150 may have a higher upper surface portion than the upper surface portion of the third preliminary mold structure and may be formed to completely cover the third preliminary mold structure. The ninth insulating interlayer 150 may be formed by depositing silicon oxide. Then, the ninth insulating interlayer 150 may be polished to expose the upper surface portion of the third preliminary mold structure.

A tenth insulating interlayer 151 may be formed on the ninth insulating interlayer 150.

Figure 9:
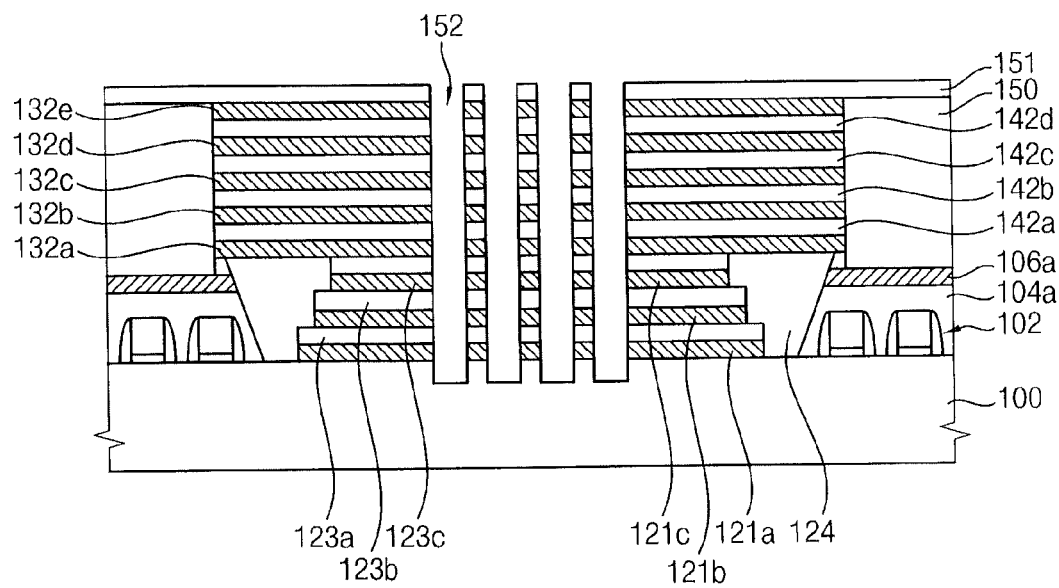

Referring to FIG. 9, an etching mask pattern (not shown) for forming channel holes 152 may be formed on the tenth insulating interlayer 151. The channel holes 152 may be formed in the cell region. The tenth insulating interlayer 151, the third preliminary mold structure and the first mold structure may be sequentially etched using the etching mask pattern as an etching mask to form a plurality of the channel holes 152. The surface portion of the substrate 100 may be exposed at the bottom portions of the channel holes 152. The channel holes 152 may be arranged in a row.

Figure 10:
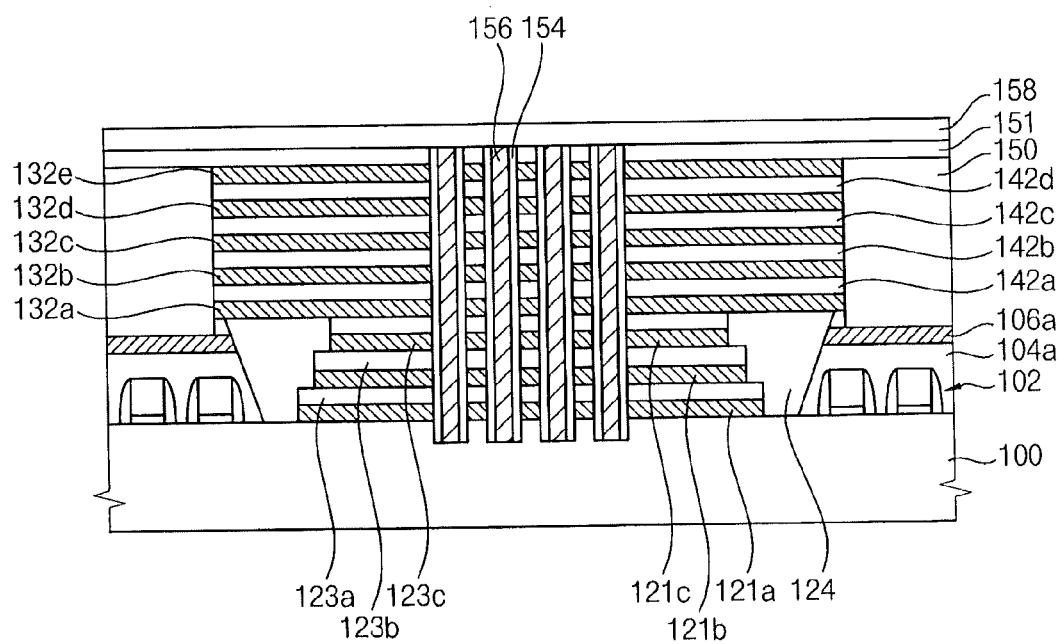

Reference is now made to FIG. 10. A thin layer structure 154 may be formed by integrating a blocking dielectric layer, a charge storing layer and a tunnel insulating layer on sidewall portions of the channel holes 152. The blocking dielectric layer, the charge storing layer and the tunnel insulating layer may be formed as an ONO structure obtained by integrating silicon oxide, silicon nitride and silicon oxide. In some embodiments, the blocking dielectric layer may be formed using metal oxide having a high dielectricity, and the charge storing layer and the tunnel insulating layer may be formed using silicon nitride and silicon oxide, respectively.

A semiconductor material layer may be formed to completely fill up inner portions of the channel holes 152 including the blocking dielectric layer, the charge storing layer and the tunnel insulating layer formed on the sidewall portions of the channel holes 152. The semiconductor material layer may include a polysilicon layer. The polysilicon layer may contact the surface portion of the substrate 100 exposed through the bottom portions of the channel holes 152. Then, the polysilicon layer may be polished to expose the tenth insulating interlayer 151 and to form a channel layer pattern 156 in the channel hole 152.

The depositing process to form the thin layer structure 154 may be performed at a high temperature of about 800° C. or over for about several ten minutes or over. Through performing the high temperature process for about several ten minutes or over, hydrogen gas may be outgased from the mold structure including the integrated structure of silicon oxide and silicon nitride. However, the outgassing of hydrogen from the mold structure may not be performed smoothly and a problem of lifting off of the thin layer included in the mold structure may be frequently generated. Some embodiments provide that the integrated mold structure of silicon oxide and silicon nitride may be generally formed throughout entire portions of the cell region and the peripheral region. In this case, hydrogen gas may not be outgased through the edge portion of the mold structure. Even when the depositing process may be performed at about 750° C. or over for about several ten minutes, most of the thin layers included in the mold structure may be lifted off.

In accordance with some embodiments, the third preliminary mold structure may be formed only in the cell region or in the cell region and the peripheral region adjacent to the cell region. Accordingly, the hydrogen gas may be completely outgased through the edge portion of the third preliminary mold structure during performing the high temperature depositing process and the lifting off of the thin layers included in the third preliminary mold structure may not be generated. Particularly, the thin layer included in the mold structure may not be lifted off even though performing the depositing process at a temperature of about 800° C. or over for about several ten minutes.

After that, an eleventh insulating interlayer 158 covering the channel layer pattern 156 may be formed on the tenth insulating interlayer 151.

Figure 11:
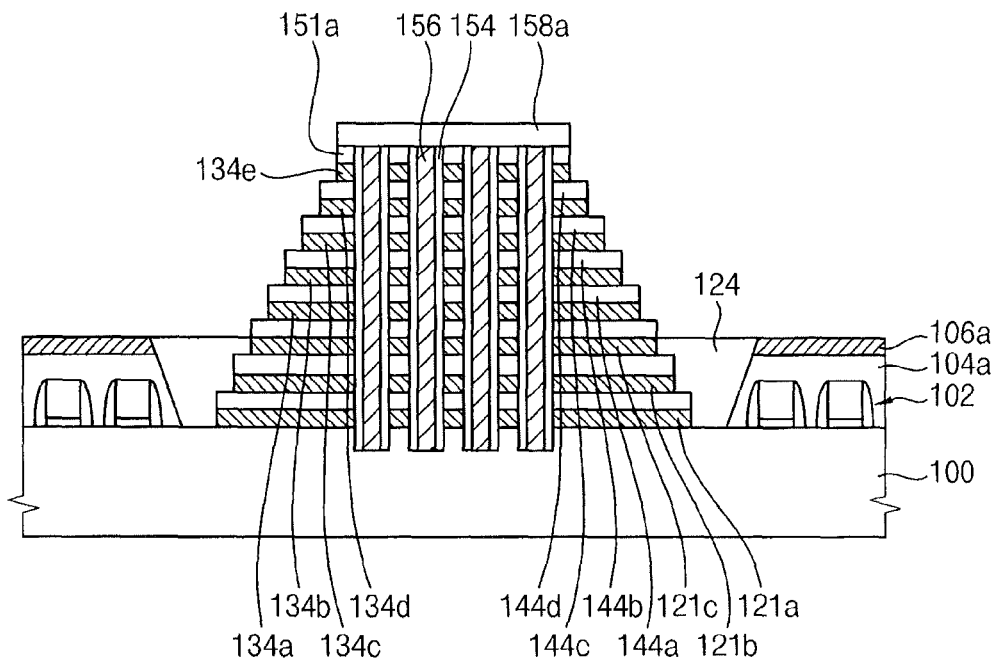

Referring to FIG. 11, the edge portion of the third preliminary mold structure may be etched one by one to form fifth, sixth, seventh, eighth and ninth sacrificing layer patterns 134a, 134b, 134c, 134d and 134e, fifth, sixth, seventh and eighth insulating interlayer patterns 144a, 144b, 144c and 144d, a tenth insulating interlayer pattern 151a and an eleventh insulating interlayer pattern 158a. A third mold structure including each sacrificing layer patterns forming a side edge portion of a step-like shape may be obtained. In order to form the third mold structure, several times of photolithography processes and several times of etching processes may be performed.

As described above, the edge portions of each sacrificing layer pattern in the first mold structure and the third mold structure may have the step-like shape. For example, the fifth sacrificing layer pattern 134a included in the third mold structure may be shorter than, for example, the third sacrificing layer pattern 121c included in the first mold structure. The first etch stopping layer pattern 106a in the peripheral region may be exposed through performing the etching process.

Through performing the above described processes, each of the first, second, third, fifth, sixth, seventh, eighth and ninth sacrificing layer patterns 121a, 121b, 121c, 134a, 134b, 134c, 134d and 134e included in the first and third mold structures may be provided as a word line and a word line pad through a gate replace process in a following process. In accordance with some embodiments, lifting may be rarely generated in the first and third mold structures and thus defects may be reduced while performing the following gate replace process. Accordingly, the word line and the word line pad may be formed to have a stable structure.

Figure 13:
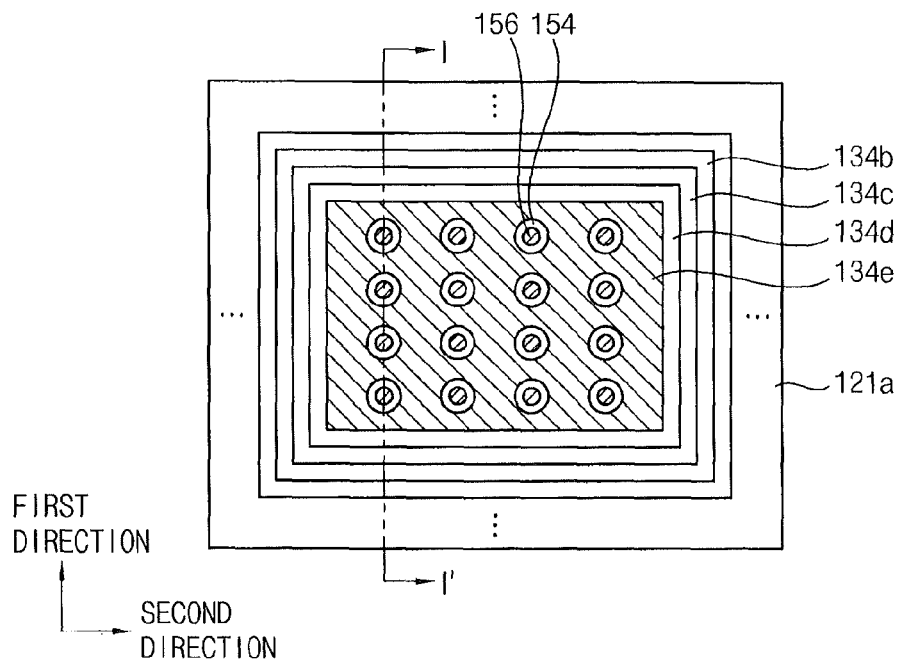
Figure 14:
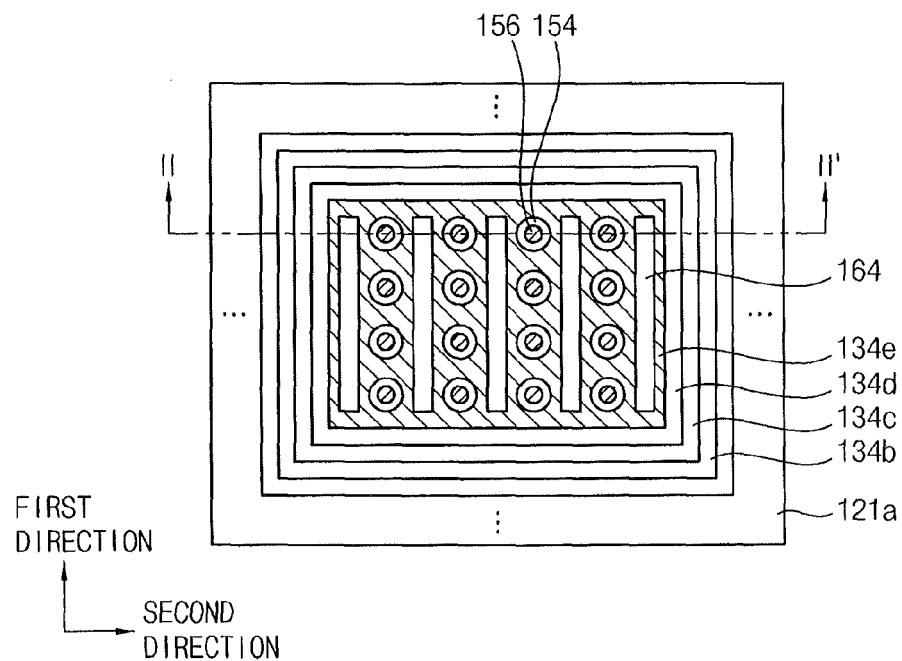

FIGS. 13 and 14 illustrate plan view for explaining methods of manufacturing a vertical type semiconductor device in accordance with some embodiments of the present invention.

Figure 15:
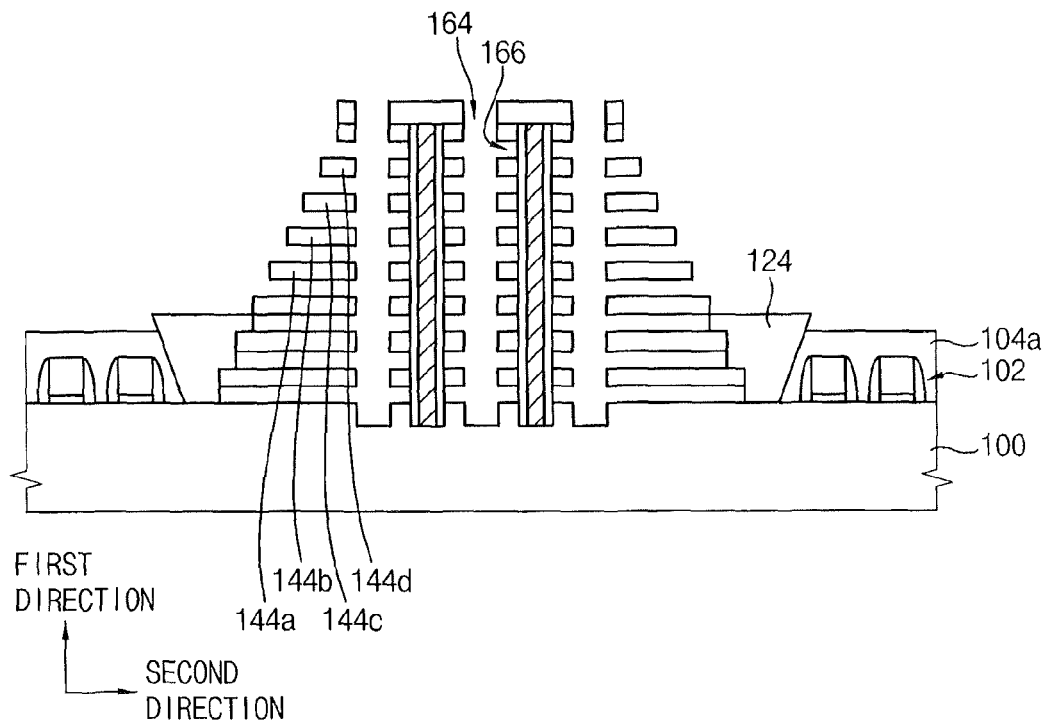
Figure 16:
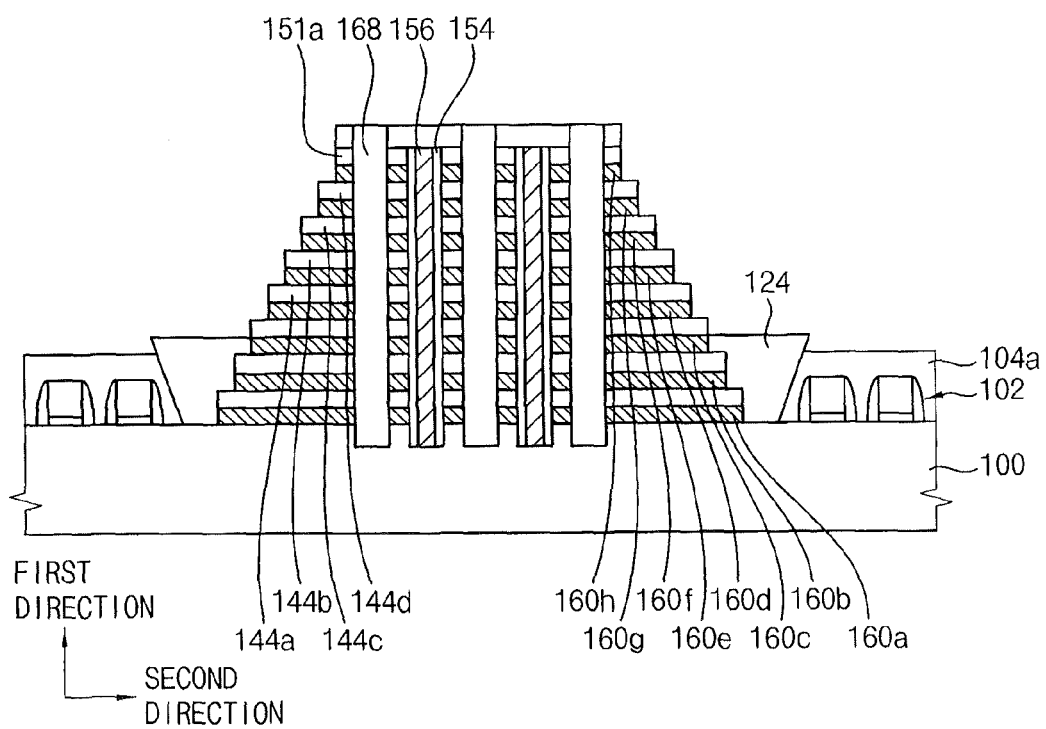
Figure 17:
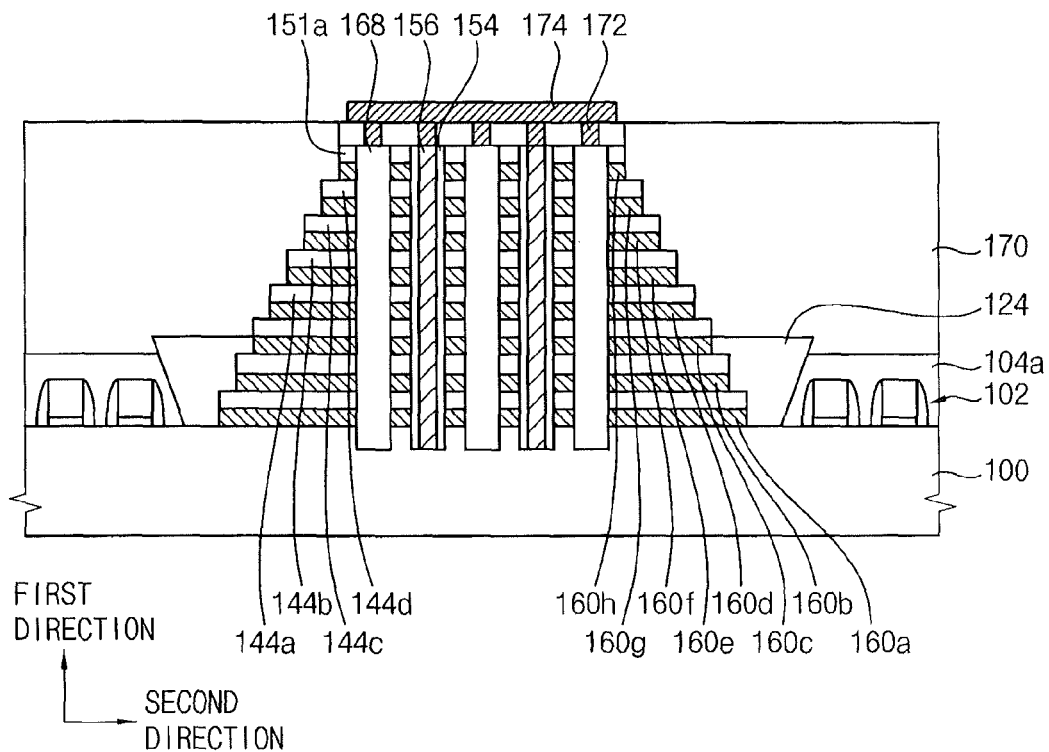

FIGS. 1 to 12 and FIG. 18 are cross-sectional views for each step cut along a line I-I' in FIG. 13. FIGS. 15 to 17 are cross-sectional views for each step cut along a line II-II' in FIG. 14.

Figure 12:
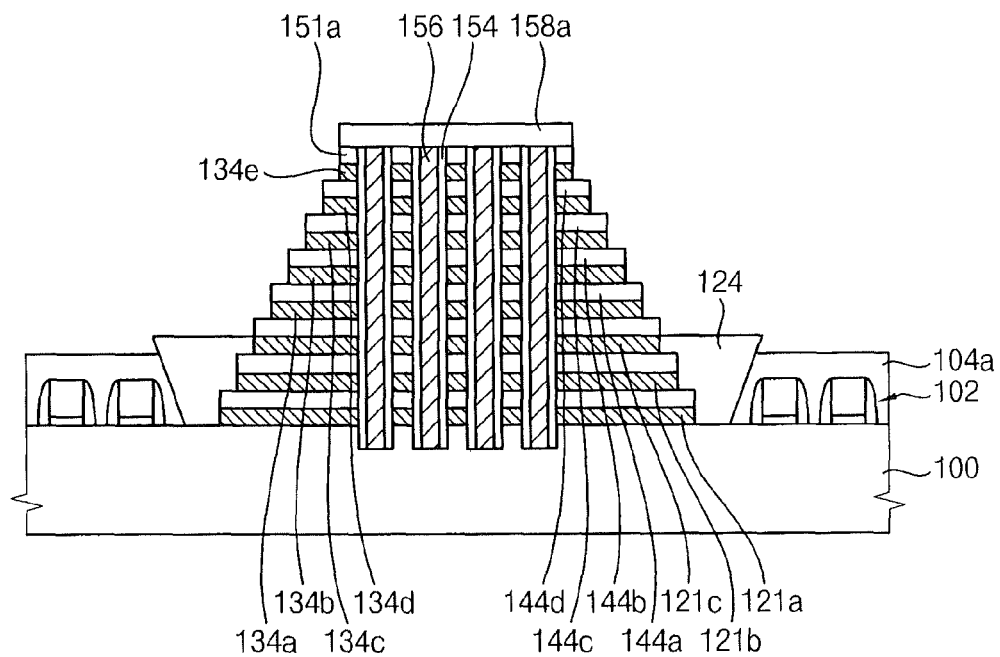

Referring to FIGS. 12 and 13, the first etch stopping layer pattern 106a may be removed. As provided in processes that are described above, a mold structure including integrated layers of the first, second, third, fifth, sixth, seventh, eighth and ninth sacrificing layer patterns 121a, 121b, 121c, 134a, 134b, 134c, 134d and 134e and the second, third, fourth, fifth, sixth, seventh and eighth insulating interlayer patterns 123a, 123b, 123c, 144a, 144b, 144c and 144d may be formed in the cell region. During forming the mold structure in the cell region, the devices formed in the peripheral region may be protected by the first etch stopping layer pattern 106a. Accordingly, the generation of defects may be reduced for the devices formed in the peripheral region and thus the peripheral region circuits may have high reliability.

Referring to FIG. 13, the side edge portions of the first, second, third, fifth, sixth, seventh, eighth and ninth sacrificing layer patterns 121a, 121b, 121c, 134a, 134b, 134c, 134d and 134e included in the first and third mold structures may form a step-like shape.

Referring to FIG. 14, the mold structure between the channel layer patterns 156 arranged in a row may be etched to form an opening portion 164. The opening portion 164 may have a trench shape extended in a first direction. The opening portion 164 may be formed by etching the mold structure to expose the surface portion of the substrate 100.

Referring to FIG. 15, after forming the opening portion 164, the first, second, third, fifth, sixth, seventh, eighth and ninth sacrificing layer patterns 121a, 121b, 121c, 134a, 134b, 134c, 134d and 134e exposed to the sidewall portion of the opening portion 164 may be removed to form grooves 166.

Referring to FIG. 16, a conductive layer (not shown) may be formed in the grooves 166 and the opening portion 164. The conductive layer may be formed by depositing a conductive material having a good step coverage characteristic to avoid generation of voids. The conductive material may include a metal, among others. The conductive material may include a material having a low electric resistance such as tungsten, tungsten nitride, titanium, titanium nitride, tantalum, tantalum nitride and/or platinum, among others. In some embodiments, a barrier metal layer may be formed first by using titanium, titanium nitride, tantalum, tantalum nitride, etc. and then, a metal layer may be formed using tungsten.

Then, the conductive layer formed in the opening portion 164 may be etched. That is, the conductive layer formed in the grooves 166 may remain to form first, second, third, fourth, fifth, sixth, seventh and eighth control gate electrodes 160a, 160b, 160c, 160d, 160e, 160f, 160g and 160h. The removal of the conductive layer may be performed by means of a wet etching process. The first, second, third, fourth, fifth, sixth, seventh and eighth control gate electrodes 160a, 160b, 160c, 160d, 160e, 160f, 160g and 160h may form a step-like sidewall edge shape. Accordingly, the sidewall edge portion of the control gate electrodes 160a, 160b, 160c, 160d, 160e, 160f, 160g and 160h may be used as a pad for connecting word lines.

As described above, the control gate electrodes 160a, 160b, 160c, 160d, 160e, 160f, 160g and 160h may be formed at the space obtained after removing the sacrificing layer patterns. In accordance with some embodiments, since the generation of lifting defects with respect to the sacrificing layer patterns and the insulating interlayer patterns may be restrained, the control gate electrodes 160a, 160b, 160c, 160d, 160e, 160f, 160g and 160h and the insulating interlayer patterns provided between the control gate electrodes 160a, 160b, 160c, 160d, 160e, 160f, 160g and 160h may be formed to have a stable structure.

Into the substrate exposed at the bottom portion of the opening portion 164 formed after etching the conductive layer, n-type impurities may be doped to form an impurity doped region (not shown) used as a source line (S/L). Some embodiments provide that the impurity doped region may be formed by doping the n-type impurities into the substrate. Further, a metal silicide pattern may be formed on the impurity doped region to reduce resistance of the source line (S/L).

An insulating layer filling up the opening portion 164 may be formed and then planarized by means of a polishing process to form a first insulating layer pattern 168.

Figure 18:
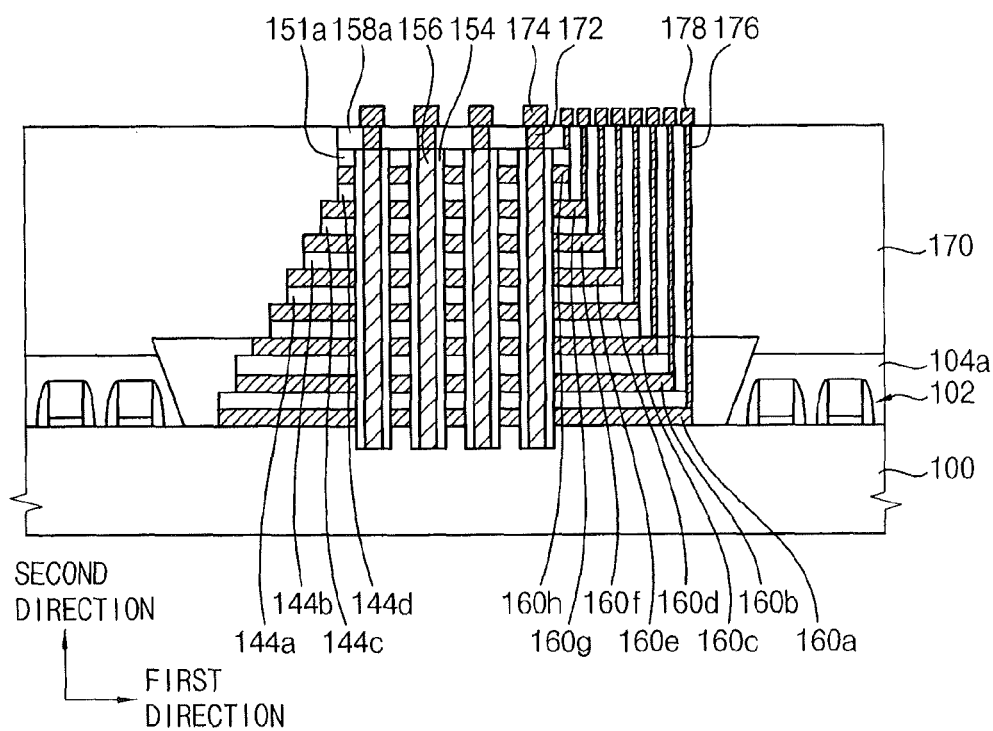

Referring to FIGS. 17 and 18, an upper insulating interlayer 170 covering the structures including the channel layer pattern 156 and the control gate electrodes 160a, 160b, 160c, 160d, 160e, 160f, 160g and 160h may be formed. A bit line contact 172 penetrating the upper insulating interlayer 170 and contacting an upper surface portion of the channel layer pattern 156 may be formed. Further, bit lines 174 contacting an upper surface portion of the bit line contact 172 may be formed. The bit lines 174 may have a line shape extended to a second direction and may be electrically connected to the channel layer patterns 156.

After that, contact plugs 176 and connecting lines 178 connected to each control gate electrode 160a, 160b, 160c, 160d, 160e, 160f, 160g and 160h formed in each layer, may be formed.

As described above, generation of a process defect due to the lifting of the sacrificing layer patterns owing to applied thermal stress during manufacturing the vertical type nonvolatile memory devices may be reduced in accordance with some embodiments disclosed herein. In addition, surface profile of remaining insulating interlayer patterns may be improved. Therefore, process costs may be reduced and device reliability may be increased.

Hereinafter, other embodiments in accordance with example embodiments will be explained.

Figure 19:
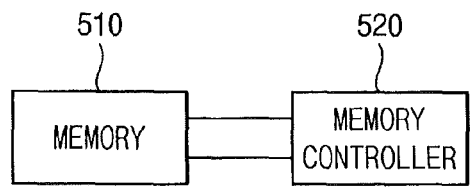

FIG. 19 illustrates a device including a vertical type semiconductor device in accordance with some embodiments disclosed herein.

Referring to FIG. 19, a device may include a memory 510 and a memory controller 520 connected to the memory 510 in accordance with some embodiments. The memory 510 may include a vertical type nonvolatile memory device manufactured by example embodiments. The memory controller 520 may provide an input signal to control an operation of the memory 510.

Figure 20:
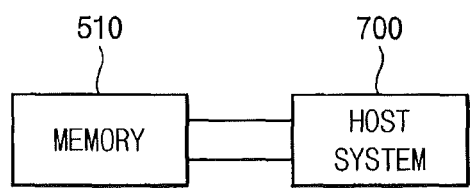

FIG. 20 illustrates another device including a vertical type semiconductor device in accordance with further embodiments disclosed herein.

Referring to FIG. 20, a device may include a memory 510 connected to a host system 700. The memory 510 may include a vertical type nonvolatile memory device manufactured by example embodiments.

The host system 700 may include electronic appliances such as a personal computer, a camera, a mobile device, a game machine, a communication device, etc. The host system 700 may apply an input signal to control and operate the memory 510 and the memory 510 may be used as a data storing medium.

Figure 21:
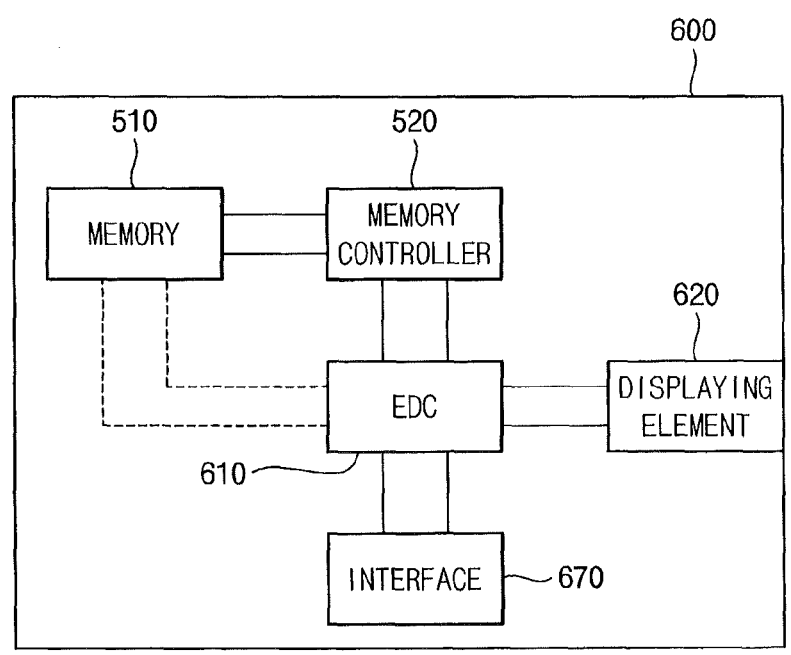

FIG. 21 illustrates further devices including a vertical type semiconductor device in accordance with some embodiments disclosed herein. The device represents a portable device 600.

The portable device 600 may include an MP3 player, a video player, a combination device of a video player and an audio player, etc.

Referring to FIG. 21, the portable device 600 may include a memory 510 and a memory controller 520. The memory 510 may include a vertical type nonvolatile memory device in accordance with example embodiments. The portable device 600 may also include an encoder/decoder (EDC) 610, a displaying element 620 and an interface 670. Data including audio data and video data may be inputted/outputted by the encoder/decoder 610 via the memory controller 520.

As described above, a vertical nonvolatile memory device having a good performance may be manufactured in accordance with some embodiments. The vertical type nonvolatile memory device may be positively applied to a highly integrated semiconductor device.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a vertical type semiconductor device, comprising:
   forming a stopping layer pattern in a first region of a substrate;
   forming a first mold structure in a second region of the substrate that is adjacent the first region, the first mold structure including first sacrificial patterns and first interlayer patterns stacked alternately;
   forming a second mold structure on the first mold structure and the stopping layer pattern, the second mold structure including second sacrificial patterns and second interlayer patterns stacked alternately, the second mold structure partially covering the stopping layer pattern; and
   forming a channel pattern passing through the first mold structure and the second mold structure.

2. The method of manufacturing a vertical type semiconductor device according to claim 1, further comprising performing a planarizing operation after forming the first mold structure and before forming the second mold structure.

3. The method of manufacturing a vertical type semiconductor device according to claim 1, further comprising forming a second stopping layer pattern on the stopping layer pattern in the first region.

4. The method of manufacturing a vertical type semiconductor device according to claim 3, wherein the second stopping layer pattern includes a same material as the second sacrificial patterns.

5. The method of manufacturing a vertical type semiconductor device according to claim 3, further comprising removing the second stopping layer pattern before forming the second mold structure.

6. The method of manufacturing a vertical type semiconductor device according to claim 1, wherein the second mold structure includes a first width, wherein a portion of the first mold structure that faces the second mold structure includes a second width, and wherein the first width is greater than the second width.

7. The method of manufacturing a vertical type semiconductor device according to claim 1, further comprising forming a first insulating pattern between the first mold structure and the stopping layer pattern, wherein the first insulating pattern and the first mold structure have upper surfaces that are substantially a same height from an upper surface of the substrate.

8. The method of manufacturing a vertical type semiconductor device according to claim 1, wherein a side of the first mold structure includes a stairstep shape.

9. The method of manufacturing a vertical type semiconductor device according to claim 1, wherein the stopping layer pattern comprises a material having an etching selectivity with the second sacrificial patterns and the second interlayer patterns.

10. The method of manufacturing a vertical type semiconductor device according to claim 9, wherein the stopping layer pattern comprises polysilicon.

11. The method of manufacturing a vertical type semiconductor device according to claim 1, wherein forming the stopping layer pattern is completed before forming the first mold structure.

12. The method of manufacturing a vertical type semiconductor device according to claim 1, further comprising forming an insulating layer after forming the second mold structure and before forming the channel pattern.

13. The method of manufacturing a vertical type semiconductor device according to claim 1, further comprising forming a microelectronic component in the first region between the stopping layer pattern and the substrate.

14. The method of manufacturing a vertical type semiconductor device according to claim 1, further comprising patterning the second mold structure to make a side of the second mold structure include a stairstep shape after forming the channel pattern.

15. A method of manufacturing a vertical type semiconductor device, comprising:
   integrating an insulating interlayer pattern and a stopping layer pattern in a peripheral region on a substrate, the substrate including a cell region and the peripheral region;
   forming a first mold structure by alternately integrating a lower sacrificing layer pattern and a lower insulating interlayer pattern on the substrate in the cell region;
   forming a preliminary second mold structure by alternately integrating a sacrificing layer and an insulating interlayer on the first mold structure and the stopping layer pattern;
   partially etching a portion of the preliminary second mold structure to expose the stopping layer pattern and to form a second mold structure covering at least a whole cell region;
   forming a channel layer pattern penetrating the first and second mold structures and forming a thin layer structure by integrating a blocking dielectric layer, a charge storing layer and a tunnel insulating interlayer integrated on a sidewall portion of the channel layer pattern;
   forming a third mold structure by patterning the second mold structure so that an edge portion of the sacrificing layer included in each layer included in the second mold structure makes a step-like shape; and forming a gate electrode by replacing the lower sacrificing layer pattern and the sacrificing layer with the gate electrode.

16. The method of manufacturing a vertical type semiconductor device according to claim 15, wherein integrating the insulating interlayer pattern and the stopping layer pattern comprises:
   forming an insulating interlayer for a peripheral circuit device covering the peripheral circuit devices;
   forming a stopping layer on the insulating interlayer for the peripheral circuit device; and
   etching a portion of the stopping layer and the insulating interlayer for the peripheral circuit device to expose the substrate in the cell region.

17. The method of manufacturing a vertical type semiconductor device according to claim 15, wherein the second mold structure is larger than the cell region and smaller than a total size of the cell region and the peripheral region.

18. The method of manufacturing a vertical type semiconductor device according to claim 15, wherein forming the gate electrode comprises:
   forming an opening portion by etching a portion of the first and third mold structures;
   removing the sacrificing patterns to form a groove portion between the insulating interlayer patterns included in the first and third mold structures; and
   forming the gate electrode by filling up the groove portion with a conductive material.

19. The method of manufacturing a vertical type semiconductor device according to claim 15, wherein the stopping layer pattern is positioned on a same plane with an uppermost surface of the first mold structure or the stopping layer pattern is positioned on a higher portion than the uppermost surface of the first mold structure.

20. The method of manufacturing a vertical type semiconductor device according to claim 15, further comprising:
   forming a second insulating interlayer on the whole substrate of the cell region and the peripheral region so as to cover the third mold structure; and
   planarizing an upper surface portion of the second insulating interlayer.

* * * * *